(12) United States Patent
Fukuma et al.

(10) Patent No.: US 9,967,990 B2
(45) Date of Patent: May 8, 2018

(54) ELECTRONIC APPARATUS

(75) Inventors: Yohei Fukuma, Chiba (JP); Tomoaki Takuma, Kanagawa (JP); Shigeru Yoshida, Tokyo (JP); Tetsu Sumii, Kanagawa (JP); Keita Hibi, Tokyo (JP)

(73) Assignee: Saturn Licensing LLC, New York, NY (US)

( * ) Notice: Subject to any disclaimer, the term of this patent is extended or adjusted under 35 U.S.C. 154(b) by 0 days. days.

(21) Appl. No.: 14/119,055

(22) PCT Filed: May 18, 2012

(86) PCT No.: PCT/JP2012/062768
§ 371 (c)(1),
(2), (4) Date: Nov. 20, 2013

(87) PCT Pub. No.: WO2012/165173
PCT Pub. Date: Dec. 6, 2012

(65) Prior Publication Data
US 2014/0092539 A1 Apr. 3, 2014

(30) Foreign Application Priority Data
May 31, 2011 (JP) .................. 2011-122745

(51) Int. Cl.
*H05K 7/02* (2006.01)
*G06F 1/16* (2006.01)
(Continued)

(52) U.S. Cl.
CPC ......... *H05K 7/02* (2013.01); *G02F 1/133308* (2013.01); *G06F 1/1601* (2013.01);
(Continued)

(58) Field of Classification Search
CPC ............ G06F 1/1637; G02F 1/133308; G02F 1/133608; G02F 2001/133312;
(Continued)

(56) References Cited

U.S. PATENT DOCUMENTS 5,268,816 A * 12/1993 Abell et al. .............. 361/679.09
6,490,016 B1 * 12/2002 Koura ............................ 349/58
(Continued)

FOREIGN PATENT DOCUMENTS

| JP | 55-64276 A | 5/1980 |
| JP | S5564276 A | 5/1980 |

(Continued)

OTHER PUBLICATIONS

Chinese Office Action for Application No. 201280024892.8 dated Jul. 7, 2016.
(Continued)

*Primary Examiner* — Adrian S Wilson
(74) *Attorney, Agent, or Firm* — Lerner, David, Littenberg, Krumholz & Mentlik, LLP

(57) ABSTRACT

Provided is an electronic apparatus that has enhanced strength and reduced weight. An electronic apparatus includes: a housing having two faces that face each other, having an accommodation space therein, and having an opening on one of the two faces; and an electronic device contained in the accommodation space. The housing is configured of a first member and a second member that are divided in the faces, and has a device insertion opening on at least one of opposing faces of the first member and the second member.

11 Claims, 10 Drawing Sheets

(51) Int. Cl.
*G02F 1/1333* (2006.01)
*H04N 5/64* (2006.01)

(52) U.S. Cl.
CPC ... *H04N 5/64* (2013.01); *G02F 2001/133314* (2013.01); *G02F 2001/133322* (2013.01); *G02F 2001/133331* (2013.01); *G02F 2201/46* (2013.01)

(58) Field of Classification Search
CPC ........ G02F 2001/133314; G02F 2001/133317; G02F 2001/133322; G02F 2001/133325
USPC .................. 361/679.21; 313/582; 349/58–60
See application file for complete search history.

(56) References Cited

U.S. PATENT DOCUMENTS

| | | | |
|---|---|---|---|
| 6,515,721 B2* | 2/2003 | Jin et al. .......................... | 349/58 |
| 6,549,263 B1* | 4/2003 | Kim ................. | 349/58 |
| 7,113,237 B2* | 9/2006 | Nitto et al. ..................... | 349/58 |
| 7,209,195 B2* | 4/2007 | Lin ................. | 349/58 |
| 7,218,521 B2* | 5/2007 | Kim ................. | 361/704 |
| 7,324,172 B2* | 1/2008 | Yamazaki ....................... | 349/58 |
| 7,405,925 B2 | 7/2008 | Sung | |
| 7,748,680 B2* | 7/2010 | Choi ................. | F16M 11/02 16/367 |
| 8,467,179 B2* | 6/2013 | Probst .................. | G06F 1/1616 345/168 |
| 8,542,481 B2* | 9/2013 | Lim et al. ................. | 361/679.26 |
| 2001/0019377 A1* | 9/2001 | Fukayama et al. ............. | 349/58 |
| 2002/0080297 A1 | 6/2002 | Sung | |
| 2003/0169573 A1* | 9/2003 | Irie .......................... | H05K 5/02 361/752 |
| 2004/0004810 A1* | 1/2004 | Kim ..................... | G06F 1/1601 361/679.29 |
| 2004/0141101 A1* | 7/2004 | Osu et al. ....................... | 349/58 |
| 2005/0152103 A1* | 7/2005 | Peng ..................... | F16M 11/00 361/679.29 |
| 2006/0028790 A1* | 2/2006 | Baek .............................. | 361/681 |
| 2006/0067036 A1* | 3/2006 | Lin .......................... | G06F 1/162 361/679.06 |
| 2006/0077629 A1* | 4/2006 | Shiraishi ............... | G06F 1/1601 361/679.22 |
| 2006/0139271 A1* | 6/2006 | Okuda ............................ | 345/88 |
| 2007/0090233 A1* | 4/2007 | Choi ..................... | F16M 11/02 248/122.1 |
| 2007/0236873 A1* | 10/2007 | Yukawa et al. ............... | 361/681 |
| 2009/0049773 A1* | 2/2009 | Zadesky et al. ........... | 52/204.62 |
| 2009/0147171 A1* | 6/2009 | Yang et al. ..................... | 349/58 |
| 2009/0231794 A1 | 9/2009 | Bhutani | |
| 2010/0014232 A1* | 1/2010 | Nishimura ................. | 361/679.3 |
| 2010/0058211 A1 | 3/2010 | Lee et al. | |
| 2010/0289390 A1 | 11/2010 | Kenney | |
| 2011/0051348 A1* | 3/2011 | Song ........................ | 361/679.26 |
| 2011/0141697 A1 | 6/2011 | Fujii et al. | |
| 2011/0228459 A1* | 9/2011 | Richardson et al. .... | 361/679.01 |

FOREIGN PATENT DOCUMENTS

| | | |
|---|---|---|
| JP | 07-146656 A | 6/1995 |
| JP | 11-259010 A | 9/1999 |
| JP | 2002-215061 A | 7/2002 |
| JP | 2010-054718 A | 3/2010 |
| JP | 2011122745 A | 6/2011 |
| RU | 2420028 C2 | 5/2011 |

OTHER PUBLICATIONS

Chinese Office Action for Chinese Application No. 201280024892.8 dated Aug. 5, 2015.
Chinese Office Action for Chinese Application No. 2012800248928 dated Mar. 14, 2016.
Chinese Office Action for Chinese Application No. 2012800248928 dated Jul. 7, 2016.
Chinese Office Action for Chinese Application No. 2012800248928 dated Jan. 25, 2017.
Chinese Rejection Decision for Chinese Application No. 2012800248928 dated May 3, 2017.

* cited by examiner

[ FIG. 1 ]
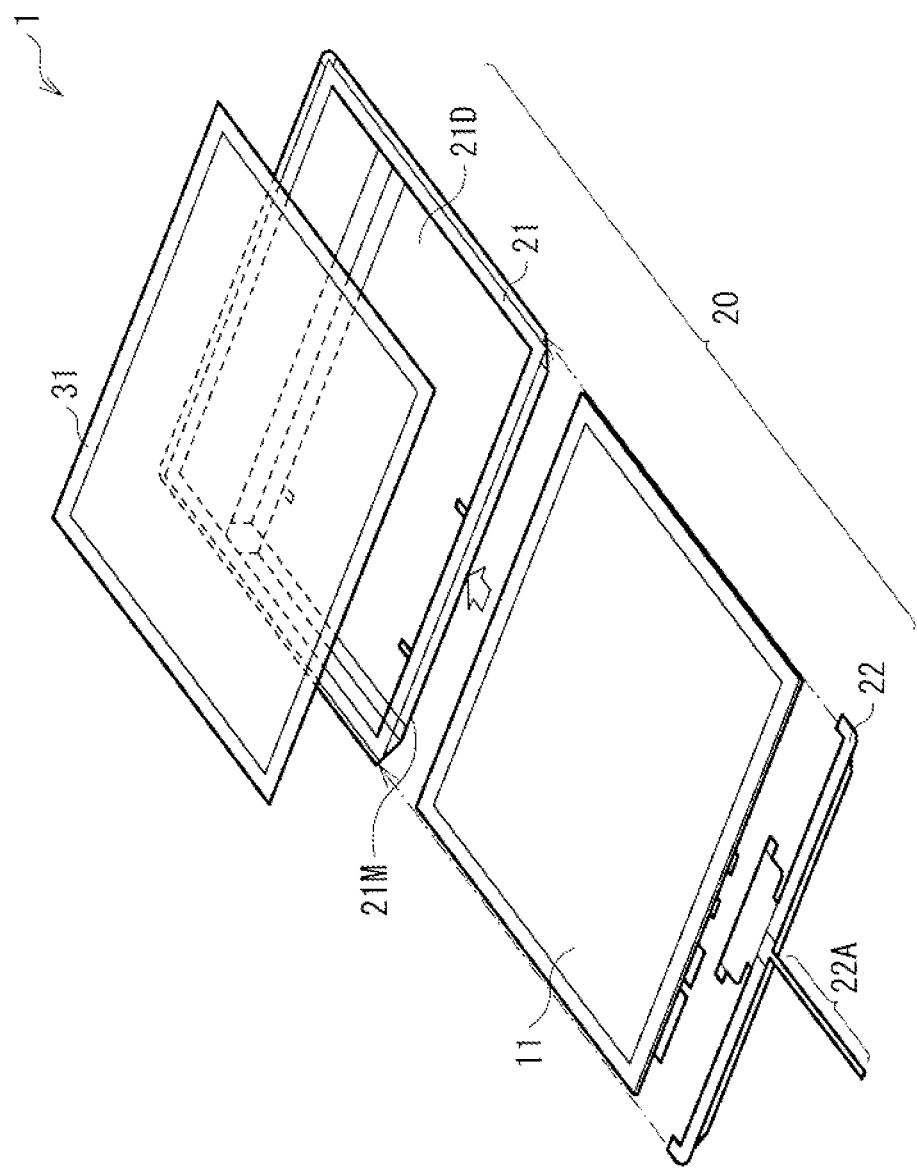

[ FIG. 2 ]
(A)
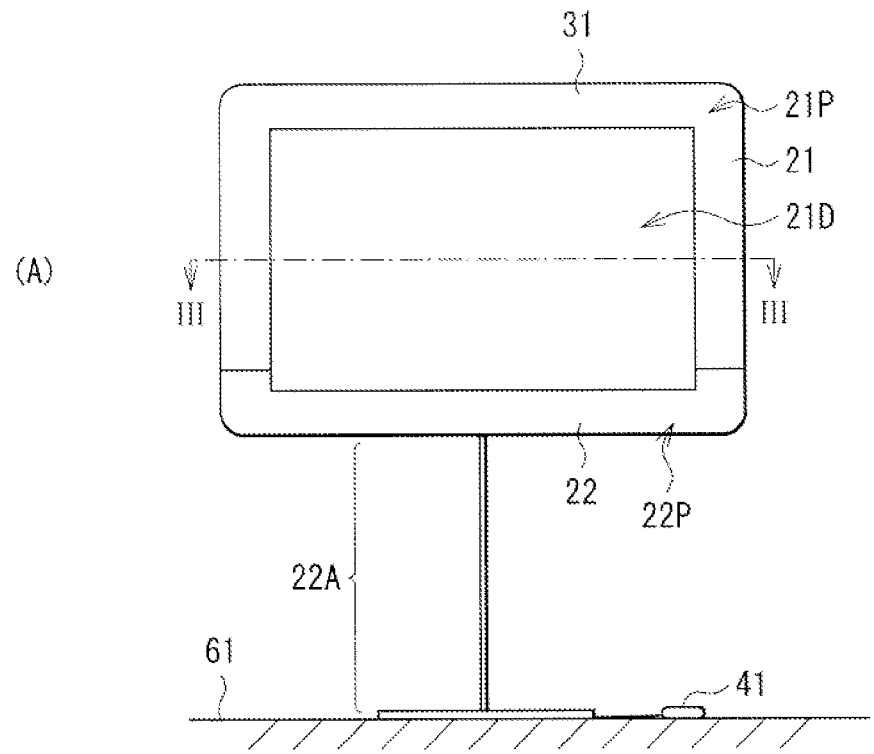
(B)
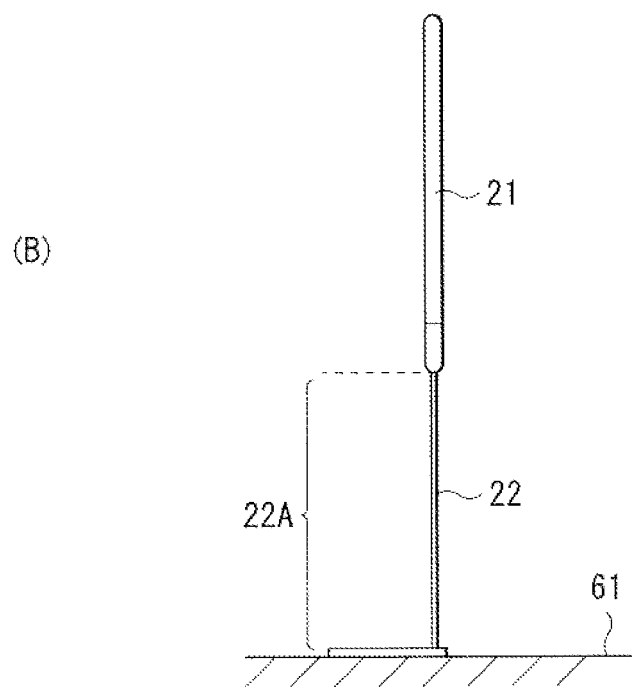

[ FIG. 3 ]
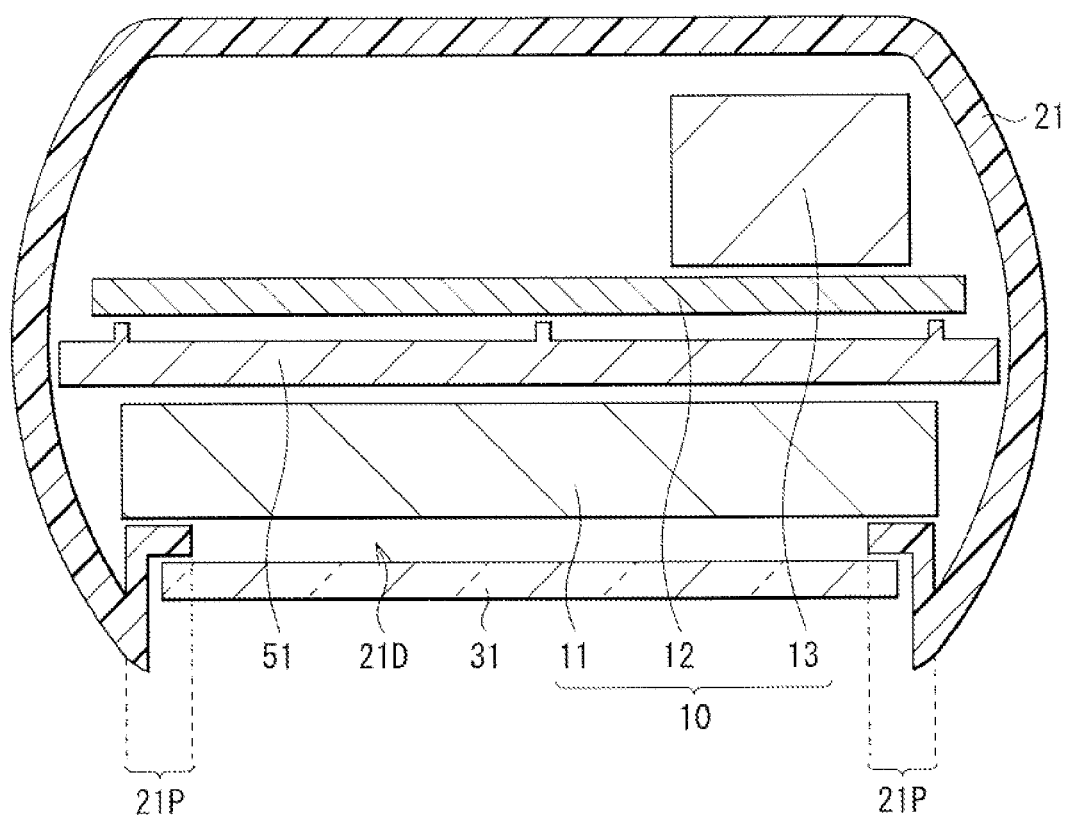

[FIG. 4]
(A) 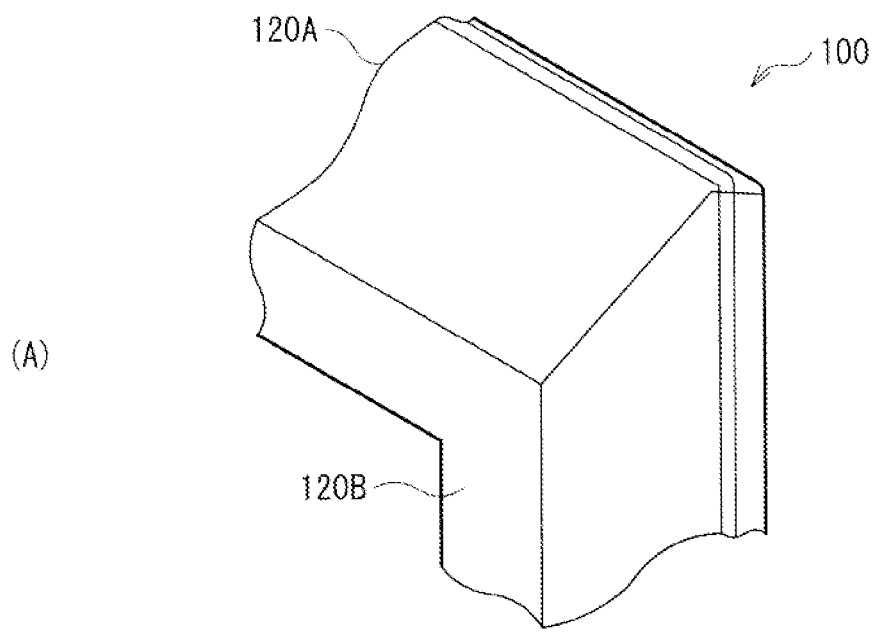
(B) 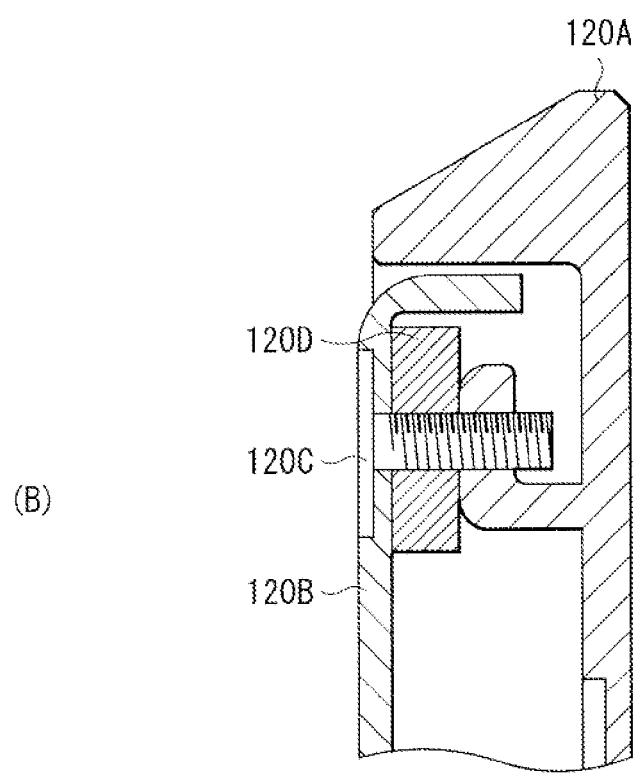

[FIG. 5]
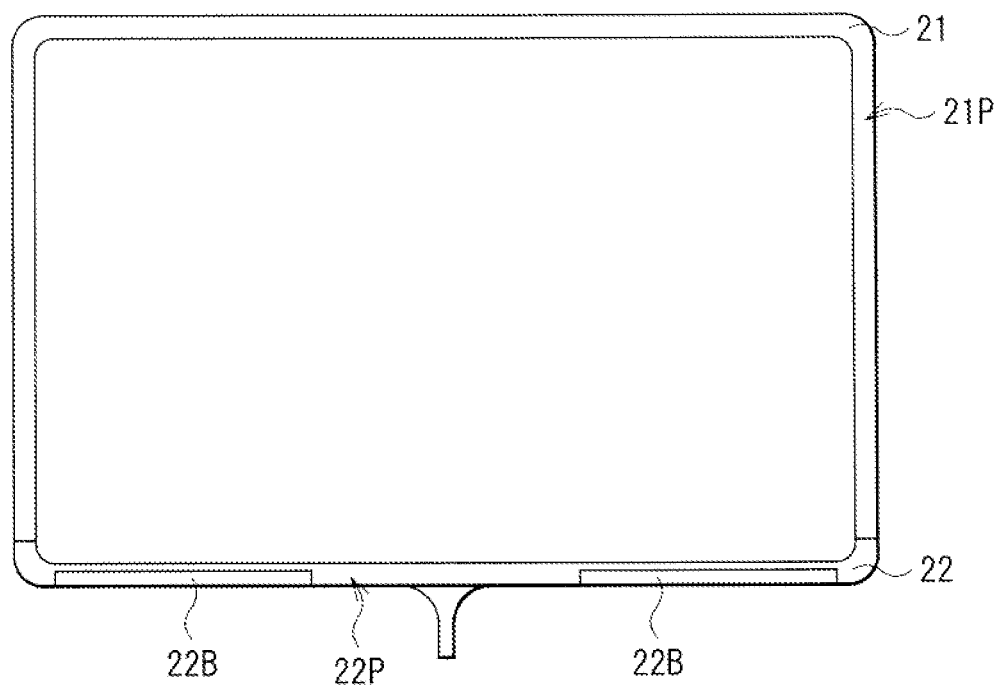

[ FIG. 6 ]
(A)
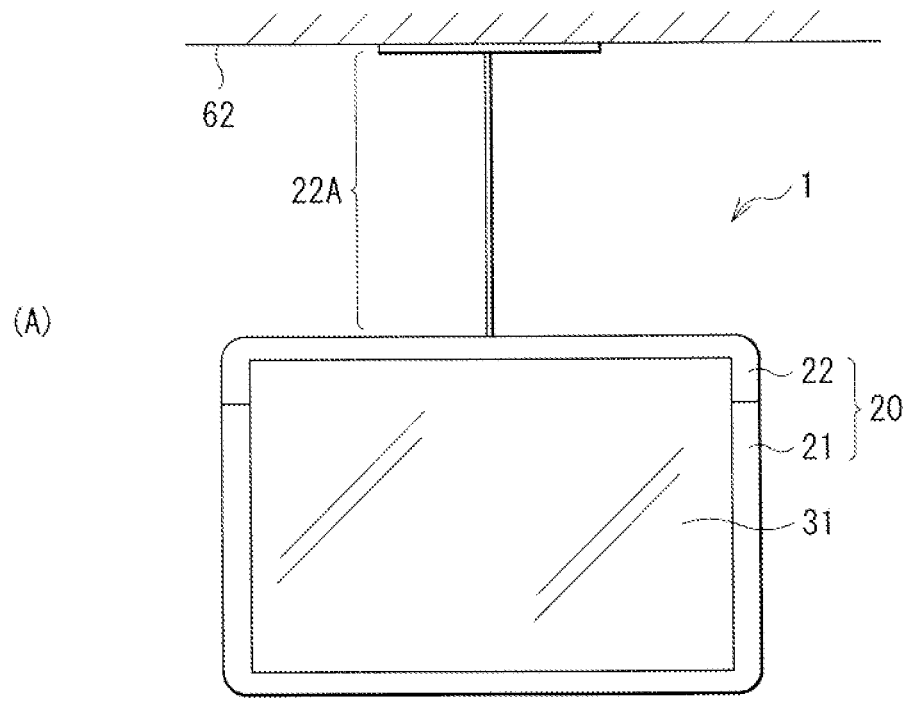
(B)
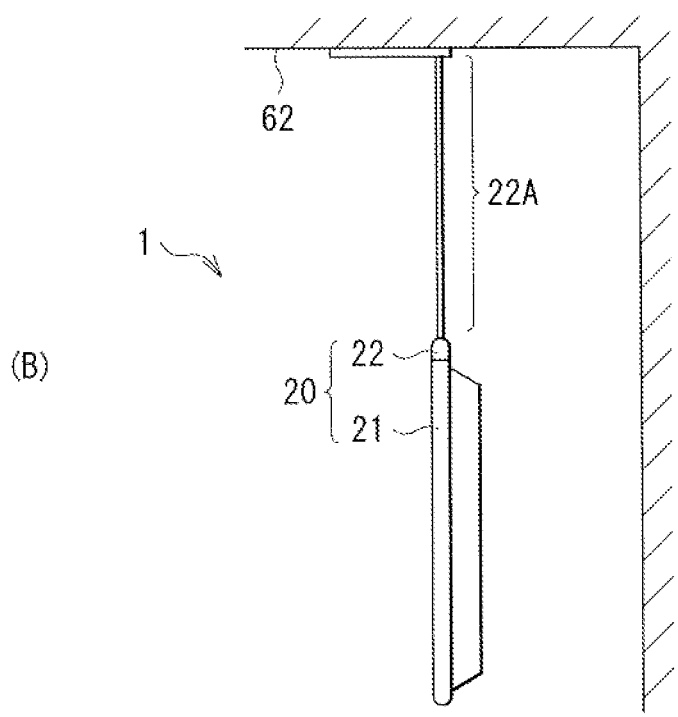

[FIG. 7]
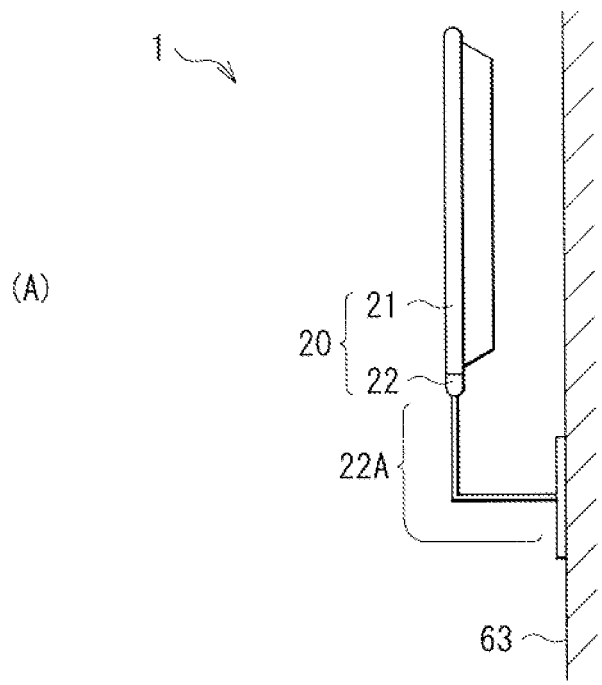
(A)
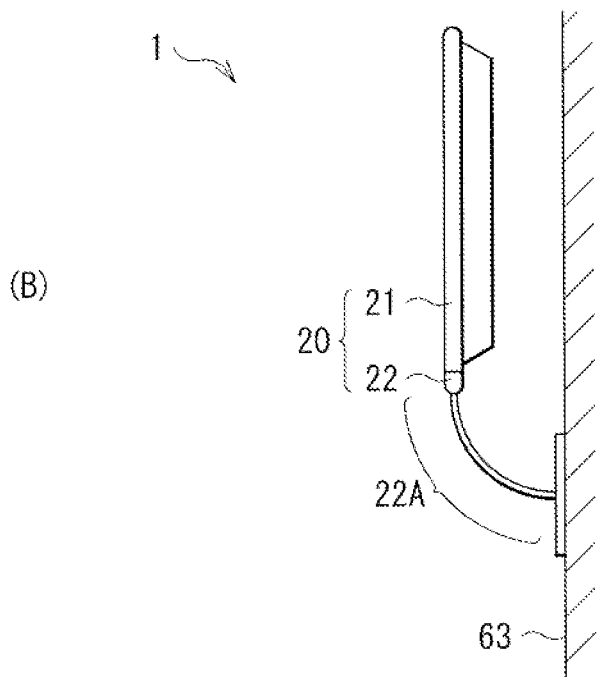
(B)

[FIG. 8]
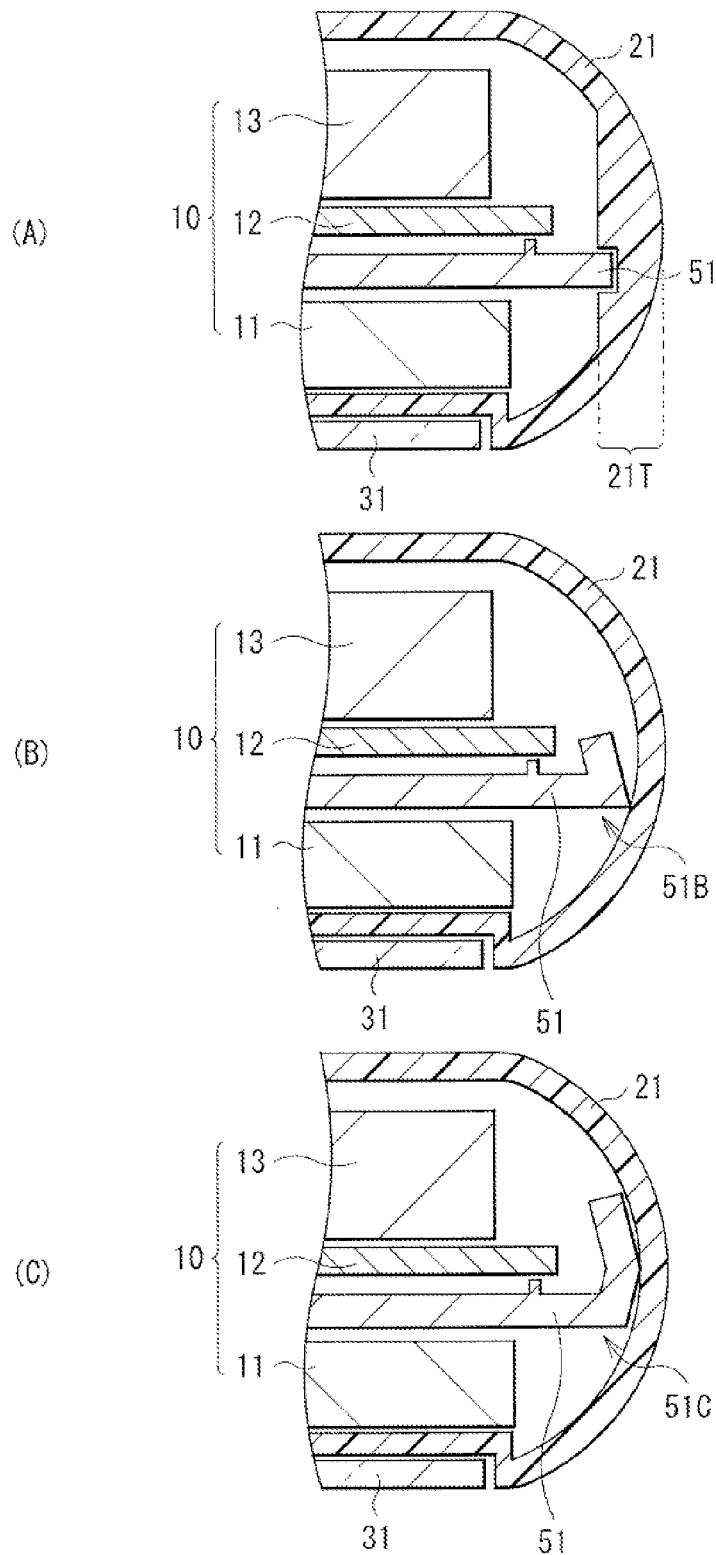

[ FIG. 9 ]
(A)
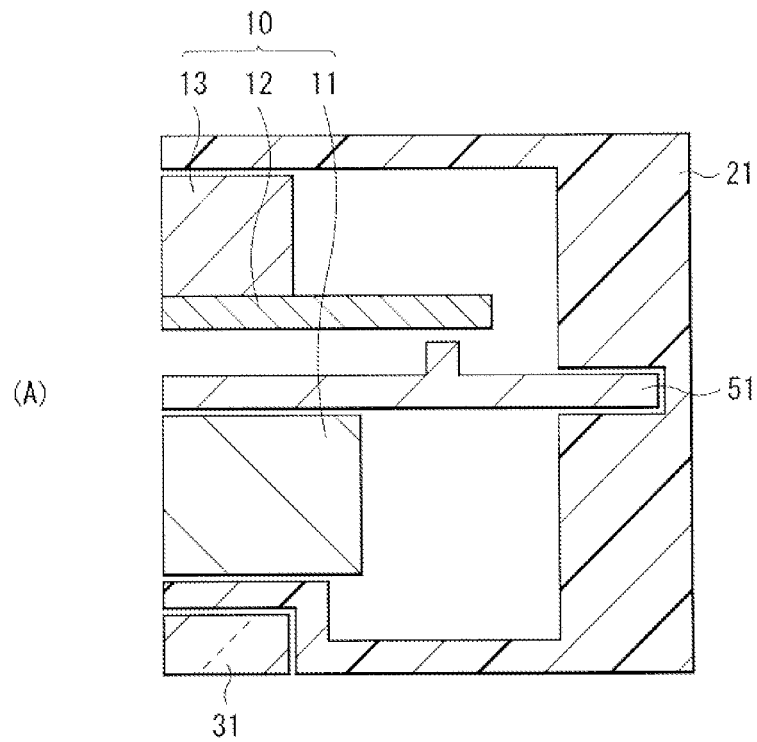
(B)
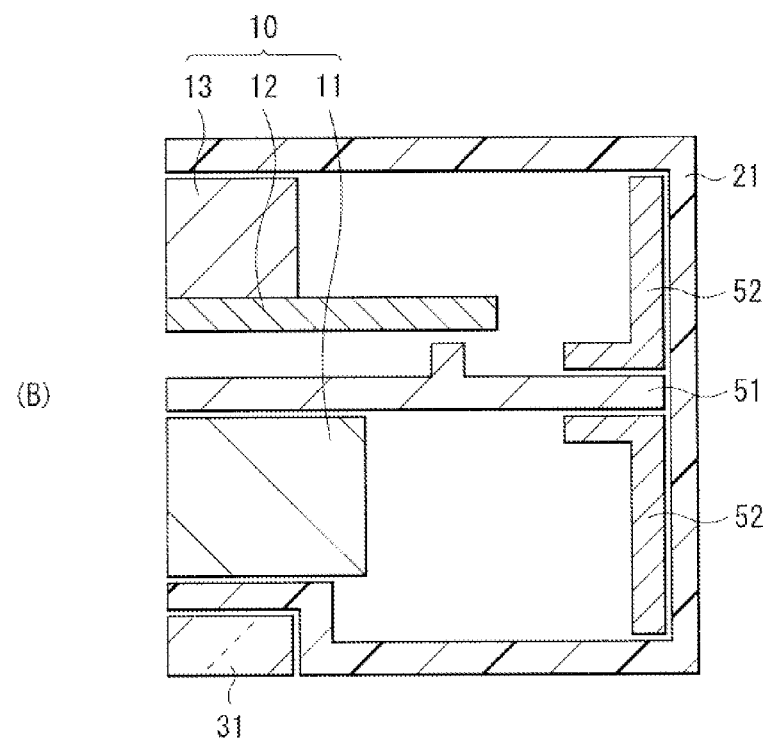

[ FIG. 10 ]
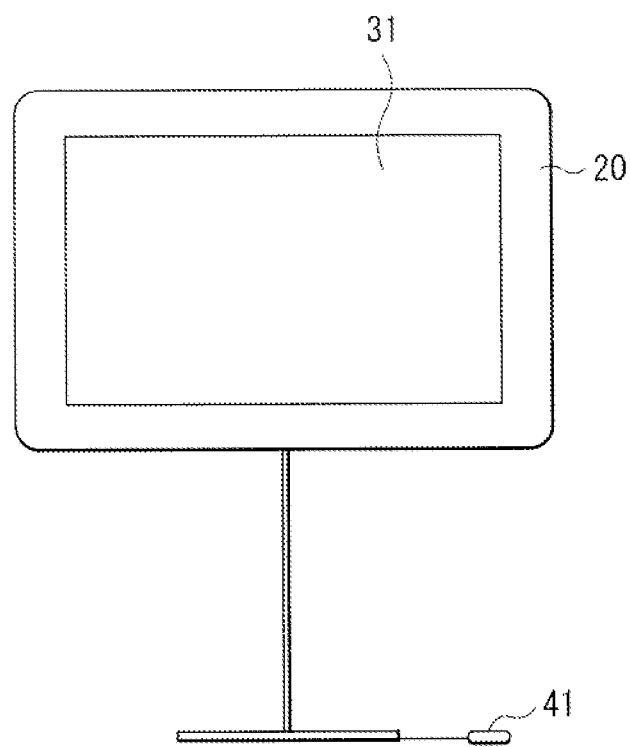

ELECTRONIC APPARATUS

CROSS-REFERENCE TO RELATED APPLICATION

The present application is a national phase entry under 35 U.S.C. § 371 of International Application No. PCT/JP2012/062768 filed May 18, 2012, published on Dec. 6, 2012, as WO 2012/165173 A1, which claims priority from Japanese Patent Application No. JP 2011-122745 filed in the Japanese Patent Office on May 31, 2011.

TECHNICAL FIELD

The present technology relates to an electronic apparatus suitable for a display such as a television receiver.

BACKGROUND ART

With the technological advancement of display panels and electronic components, thickness reduction of electronic apparatuses, especially the displays such as liquid crystal displays, has been progressed rapidly, and television receivers and the like have been improved in appearance design. In such displays, a front-face housing on a display-surface side and a rear-face housing on a back-face side are fastened by screws or the like, and a display panel is placed between the front-face housing and the rear-face housing (see, for example, Patent Literature 1).

CITATION LIST

Patent Literature

Patent Literature 1: Japanese Unexamined Patent Application Publication No. 2010-54718

SUMMARY OF THE INVENTION

However, in recent years, it has been desired, in addition to appearance design, to enhance flexibility in installation by eliminating imitations in installation locations and installation methods. To this end, improvements in strength and weight reduction of displays are necessary. In displays up to now, however, a front-face housing on a display-surface side and a rear-face housing on a back-face side are separate components, and screws and the like are necessary, and therefore, they are insufficient in terms of both strength and weight reduction.

Accordingly, it is desirable to provide an electronic apparatus that has an enhanced strength and a reduced weight, and is adaptable to various installation locations and installation methods.

A first electronic apparatus according to an embodiment of the present technology includes: a housing having two faces that face each other, having an accommodation space therein, and having an opening on one of the two faces; and an electronic device contained in the accommodation space. The housing is configured of a first member and a second member that are divided in the faces, and has a device insertion opening on at least one of opposing faces of the first member and the second member.

A second electronic apparatus according to an embodiment of the present technology includes: a housing having two faces that face each other, having an accommodation space therein, and having an opening on one of the two faces; and an electronic device contained in the accommodation space.

In the first or the second electronic apparatus of the embodiment, both faces as well as side faces between these faces of the electronic device are integrally covered by a single housing. Thus, strength improves as compared with an existing structure in which a front-face housing and a rear-face housing are provided.

According to the first and the second electronic apparatuses of the embodiments of the present technology, both faces as well as side faces between these faces of the electronic device are integrally covered by a single housing. Therefore, strength improves, and weight reduction is also allowed because screws and the like are unnecessary.

BRIEF DESCRIPTION OF DRAWINGS

[FIG. 1] FIG. 1 is an exploded perspective view illustrating a configuration of a display (an electronic apparatus) according to an embodiment of the present disclosure.

[FIG. 2] Part (A) of FIG. 2 is a front view illustrating a configuration of the display illustrated in FIG. 1, and Part (B) of FIG. 2 is a side view thereof.

[FIG. 3] FIG. 3 is a cross-sectional diagram illustrating a configuration of the display illustrated in FIG. 1.

[FIG. 4] FIG. 4 is a diagram illustrating a configuration of an existing display.

[FIG. 5] FIG. 5 is a front view used to describe details of an upper member illustrated in FIG. 2.

[FIG. 6] Part (A) of FIG. 6 is a front view illustrating a configuration of a modification of a support section illustrated in FIG. 2, and Part (B) of FIG. 6 is a side view thereof.

[FIG. 7] Part (A) of FIG. 7 is a side view illustrating a configuration of another modification of the support section illustrated in FIG. 2, and Part (B) of FIG. 7 is a side view illustrating a modification of the support section illustrated Part (A) of FIG. 7.

[FIG. 8] FIG. 8 is a diagram including cross-sectional views each illustrating a modification of the upper member and a center chassis illustrated in FIG. 3.

[FIG. 9] FIG. 9 is a diagram including cross-sectional views each illustrating another modification of the upper member illustrated in FIG. 3.

[FIG. 10] FIG. 10 is a front view illustrating a modification of the display illustrated in FIG. 2.

MODES FOR CARRYING OUT THE INVENTION

An embodiment of the present technology will be described below in detail with reference to the drawings.

Embodiment

FIG. 1 illustrates each element of a display (a display 1) according to an embodiment of the present disclosure. Part (A) of FIG. 2 illustrates a configuration of the display 1 when viewed from a display surface (a surface) side, and Part (B) of FIG. 2 illustrates a configuration when viewed from a side-face side. FIG. 3 illustrates a cross-sectional configuration taken along a line III-III in Part (A) of FIG. 2. The display 1 may be a liquid crystal display that may be used, for example, as a television receiver. This display 1 is a display in which an electronic device 10 is contained in an accommodation space of a housing 20, and an outermost surface is provided with a glass plate 31. When electric power is supplied from an AC adapter 41, the electronic device 10 is irradiated with light from a light source (not illustrated) on a side-face side, and the light is extracted as display light from an opening 21D of the housing 20.

The electronic device 10 includes a display panel 11 and an electronic substrate 12 as illustrated in FIG. 3. A control device 13 is mounted on or connected to the electronic substrate 12. The display panel 11 may be, for example, a liquid-crystal display panel having a liquid crystal layer between two substrates made of transparent plate glass or the like. In one of the substrates, a drive circuit used to supply an image signal to each pixel, and the like are provided together with a TFT (Thin Film Transistor) that drives each pixel, a transparent electrode, and an alignment film. In the other of the substrates, color filters of three primary colors (R, G, B) which are not illustrated are provided for the respective pixels, together with a transparent electrode and an alignment film. The circumference of the liquid crystal layer is sealed by a sealant. A display surface and a back face of the display panel 11 are each provided with a polarizing plate.

The electronic substrate 12 is provided on the back-face side of the display panel 11, and may be, for example, electrically connected to the display panel 11 by a flexible wiring substrate or the like. The control device 13 may be configured of, for example, a main board, a communication board, a power source, a tuner, a speaker, and the like. The display panel 11 is driven by a signal supplied from the control device 13.

Between the display panel 11 and the electronic substrate 12 in the housing 20, a center chassis 51 is provided, and the electronic substrate 12 is fixed to this center chassis 51. Providing this center chassis 51 reinforces rigidity of the display panel 11 and makes it possible to bring the display panel 11 close to the electronic substrate 12. Further, as illustrated in FIG. 3, it is possible to prevent damage to both of the display panel 11 and the electronic substrate 12, by providing a projection on the center chassis 51. The center chassis 51 is fat-shaped or shaped like a frame (a bezel), and may be configured using a material such as a metallic material including iron and aluminum, a resin material, and a composite material including a carbon filler and a glass filler.

The housing 20 has two faces that face each other, namely, a display surface (one of the faces) and a back face, as well as two side faces between these two faces. The shape of the housing 20 is allowed to be changed as appropriate, according to the shape of the electronic device 10. The housing 20 is configured of an upper member 21 (a first member) and a lower member 22 (a second member) that are separated in an in-plane direction (a vertical direction on a sheet surface of FIG. 2) of the display surface and the back face, and the upper member 21 serving as a housing main body has an insertion opening (a device insertion opening) 21M on a face that faces the lower member 22. The display panel 11 is housed in the housing 20, through this insertion opening 21M. The lower member 22 serves, here, as a cover body. In a central part of the surface of the housing 20, the opening 21D is provided to expose the display panel 11, and panel retaining sections 21P and 22P are provided on the surface of the housing 20 to surround the opening 21D.

As illustrated in FIG. 3, the upper member 21 contains the electronic device 10, by integrally covering the back face from a peripheral edge of a display surface through side faces of the electronic device 10. Although illustration is omitted, the same is true for the lower member 22. In other words, the electronic device 10 is covered from the display surface to the back face through the side faces, by a single member (the upper member 21 or the lower member 22). Thus, the strength of the display 1 is increased and the weight thereof is reduced. This will be described below by making a comparison with an existing display (a display 100).

Part (A) of FIG. 4 is a perspective view of the display 100 when viewed from a back-face side, and Part (B) of FIG. 4 is a cross-sectional diagram thereof. In the existing display 100, a display panel (not illustrated) and a spacer 120D are placed between a front-face housing 120A on a display-surface side and a rear-face housing 120B on the back-face side which are separate components, and the front-face housing 120A and the rear-face housing 120B are fastened by a screw 120C. In other words, a housing of the display 100 is configured of two components that are the front-face housing 120A and the rear-face housing 120B separated in a direction perpendicular to the display surface, and these are connected by the screw 120C. Therefore, as compared with a case in which the front-face housing 120A and the rear-face housing 120B are configured integrally, the display 100 has low rigidity, and it is necessary to increase the thickness (the wall thickness) of the housing and/or the number of screws 120C so as to improve the strength. In other words, the strength of the display 100 is low, and moreover, the multiple screws 120C are used, and/or the thickness of the housing is increased, and therefore, the weight of the display 100 also increases accordingly.

In contrast, the housing 20 of the present embodiment has the display surface and the back face, and contains the display panel 11 integrally from the peripheral edge of the display surface to the back face through the side faces of the display panel 11 (the electronic device 10). In other words, the display-surface side of the display panel 11 is supported by the panel retaining sections 21P and 22P of the housing 20, and the back-face side is entirely covered by the housing 20. Therefore, the screw 120C and the like are not necessary, and strength enhancement as well as weight reduction of the display 1 are achieved. Moreover, it is also advantageous in terms of cost, since the number of components is also reduced.

The housing 20 may be made of, for example, a material including CFRP (Carbon Fiber Reinforced Plastics). CFRP has high rigidity and makes it possible to configure the housing 20 with a thin wall and thus, the weight of the display 1 is allowed to be further reduced. Configuration using metal such as aluminum and stainless steel, other than CFRP, may also be possible, but it is preferable to use CFRP from the viewpoint of weight reduction. Using CFRP allows molding to be readily performed through auto-clave molding, hot-pressing, resin transfer molding, or the like to fabricate the housing 20, for example. Further, when CFRP is used as a constituent material of the housing 20, molding without providing a draft is allowed due to a low shrinkage rate thereof.

As illustrated in FIG. 5, a part of the lower member 22 may be provided with a signal receiving section 22B made of GFRP (Glass Fiber Reinforced Plastics). CFRP has high radio-wave shieldability, whereas GFRP has high radio-wave permeability and thus, the signal receiving section 22B is allowed to transmit and receive wireless remote-control signals and moving-image radio signals smoothly.

Further, the lower member 22 may be provided with a support section 22A used to fix the display 1 to an installation face (FIG. 1). This makes it possible to change the design, length, and the like of the support section 22A easily, and adaption to various arrangements is allowed. For example, other than installation on a floor 61 (FIG. 2), installation on a ceiling 62 as illustrated in FIG. 6 or installation on a wall surface 63 as illustrated in FIG. 7 may also be allowed. Either installation on the wall surface 63 by providing right-angled bending of the support section 22A as illustrated in Part (A) of FIG. 7, or installation on the wall surface 63 by providing arc-shaped bending of the support section 22A as illustrated in Part (B) of FIG. 7 is possible. The lower member 22 and the upper member 21 may be coupled by, for example, a bolt structure or tapes and the like, and these coupling sections are disposed at a lower end part of the display panel 11. Even if the upper member 21 and the lower member 22 are coupled by screw, it is possible to reduce the number of screws to be used, as compared with the existing display (the display 100).

As illustrated in FIG. 3, the electronic device 10 is fixed by contact between the housing 20 and an end part of the center chassis 51. For firmer fixing, the center chassis 51 may be sandwiched by the housing 20, by providing a thick section 21T at a part of the housing 20, the part facing the end part of the center chassis 51, as illustrated in Part (A) of FIG. 8. Further, the center chassis 51 may be provided with a bent section 51B formed by bending an end part thereof once toward the back-face side as illustrated in Part (B) of FIG. 8, or may be provided with a bent section 51C formed by bending the end part twice toward the back-face side as illustrated in Part (C) of FIG. 8.

The glass plate 31 is provided on the display-surface side of the display panel 11, and protects the display panel 11. At a peripheral edge portion of the display panel 11, the glass plate 31 is disposed further toward the surface side than the housing 20.

In this display 1, when light from the light source is incident upon the display panel 11, the incident light passes through the polarizing plate, and then passes through the liquid crystal layer while being modulated for each pixel, based on an image voltage applied between the transparent electrodes of the two substrates. The light having passed through the liquid crystal layer passes through the color filter to be extracted as color display light to the outside of the polarizing plate (the surface side).

Here, the housing 20 has the display surface and the back face integrally and thus, the electronic device 10, from the display surface to the back face through the side faces thereof, is housed by a single member, without providing two components that are a front-face housing (the front-face housing 120A in FIG. 4) and a rear-face housing (the rear-face housing 120B in FIG. 4). Therefore, the strength of the display 1 is allowed to be enhanced, and weight reduction is also allowed because screws (the screw 120C in FIG. 4) and the like are not necessary.

As described above, in the present embodiment, the housing 20 has the display surface and the back face integrally and thus, strength enhancement and weight reduction of the display 1 are allowed. In particular, application as the electronic device 10 to the display 1 including the display panel 11 makes it possible to increase flexibility in installation location and installation method, by virtue of strength enhancement and weight reduction.

In addition, the housing 20 may be configured using CFRP to achieve further reduction in weight and to achieve easier fabrication of the housing 20.

The present technology has been described above by providing one embodiment, but the present technology is not limited to the above-described embodiment, and may be variously modified. For example, in the above-described embodiment, the liquid crystal display is taken as an example of the display 1, but the housing 20 may be applied to a plasma display, an organic electroluminescent display, and the like. Further, not only application to the displays, but, for example, application to other electronic apparatuses such as illumination equipment and signage equipment is also allowed.

Furthermore, in the above-described embodiment, the case in which a cross section of the housing 20 is substantially oval has been taken as an example (FIG. 3), but it is not limited to this case in particular, and may be, for example, rectangular as illustrated in FIG. 9. In this case, as illustrated in Part (B) of FIG. 9, a configuration in which the center chassis 51 is supported by a center chassis supporting member 52 is also allowed.

In addition, in the above-described embodiment and the like, the case in which the coupling section of the upper member 21 and the lower member 22 is provided at the lower end of the display surface and only the upper member 21 has the insertion opening 21M has been described, but the coupling section of the upper member 21 and the lower member 22 may be provided between the upper end and the lower end, and the upper member 21 and the lower member 22 may each have an insertion opening. Moreover, in the above-described embodiment and the like, the case in which the housing 20 includes the upper member 21 and the lower member 22 has been described, but the housing 20 may be configured of a single member as illustrated in FIG. 10, without being provided with the insertion opening 21M.

It is to be noted that the present technology may adopt the following configurations.

(1) An electronic apparatus, including:
a housing having two faces that face each other, having an accommodation space therein, and having an opening on one of the two faces; and
an electronic device contained in the accommodation space,
wherein the housing is configured of a first member and a second member that are divided in the faces, and has a device insertion opening on at least one of opposing faces of the first member and the second member.
(2) The electronic apparatus according to (1), wherein the electronic device includes a display panel.
(3) The electronic apparatus according to (1) or (2), wherein the housing is made of a material including Carbon Fiber Reinforced Plastic (CFRP).
(4) The electronic apparatus according to (3), wherein a part of the housing is made of a material including Glass Fiber Reinforced Plastic (GFRP).
(5) The electronic apparatus according to any one of (1) to (4), wherein a center chassis is contained in the housing together with the electronic device, and the electronic device is fixed to the housing by the center chassis.
(6) The electronic apparatus according to (5), wherein the housing has a thick section at a part that faces an end part of the center chassis to hold the center chassis.
(7) The electronic apparatus according to (5), wherein the center chassis has a bent section at an end part thereof.
(8) The electronic apparatus according to any one of (1) to (7), wherein the second member includes a support section provided for fixation to an installation face.
(9) An electronic apparatus, including:
a housing having two faces that face each other, having an accommodation space therein, and having an opening on one of the two faces; and
an electronic device contained in the accommodation space.

The present application is based on and claims priority from Japanese Patent Application No. 2011-122745 filed in the Japan Patent Office on May 31, 2011, the entire contents of which is hereby incorporated by reference.

The invention claimed is:

1. An electronic apparatus, comprising:
   a housing having a display surface face and a back surface face that face each other and side faces therebetween, having an accommodation space therein, and having an opening on the display surface face;
   an electronic device contained in the accommodation space,
   wherein the housing is configured of a first member and a second member and has a device insertion opening on at least one opposing face of the first member or the second member; and
   a center chassis contained in the housing together with the electronic device, in which an end part surface of the center chassis facing a first side of the sides contacts a surface of the first side,
   wherein at least one of the first member or the second member is configured as a single piece without use of a fastener which extends continuously from a peripheral edge of the display surface face through the side faces and through the back surface face thereof so as to include an entirety of the side faces and the back surface face such that when the electronic device is contained in the accommodation space the at least one first member or the second member entirely covers the portion of the electronic device contained therein from the peripheral edge of the display surface face through the side faces and through the back surface face thereof.

2. The electronic apparatus according to claim 1, wherein the electronic device includes a display panel.

3. The electronic apparatus according to claim 1, wherein the housing is made of a material including Carbon Fiber Reinforced Plastic (CFRP).

4. The electronic apparatus according to claim 3, wherein a part of the housing is made of a material including Glass Fiber Reinforced Plastic (GFRP).

5. The electronic apparatus according to claim 1, wherein the electronic device is fixed to the housing by the center chassis.

6. The electronic apparatus according to claim 5, wherein the housing has a thick section at a part of at least one of the sides that faces an end part of the center chassis to hold the center chassis.

7. The electronic apparatus according to claim 5, wherein the center chassis has a bent section as the end part surface of the center chassis that contacts the surface of the first side.

8. The electronic apparatus according to claim 2, wherein the second member includes a support section provided for fixation to an installation face.

9. The electronic apparatus according to claim 1, wherein the fastener is a screw.

10. The electronic apparatus according to claim 5, wherein the center chassis includes a number of projections.

11. The electronic apparatus according to claim 5, wherein the center chassis has two bent sections as the end part surface of the center chassis that contacts the surface of the first side.

* * * * *